United States Patent [19]

Saito et al.

[11] Patent Number: 5,570,274
[45] Date of Patent: Oct. 29, 1996

[54] HIGH DENSITY MULTICHIP MODULE PACKAGING STRUCTURE

[75] Inventors: Masaru Saito; Manabu Bonkohara, both of Tokyo, Japan

[73] Assignee: NEC Corporation, Tokyo, Japan

[21] Appl. No.: 350,122

[22] Filed: Nov. 29, 1994

[30] Foreign Application Priority Data

Nov. 29, 1993 [JP] Japan ........................... 5-297137

[51] Int. Cl.$^6$ ................................... H05K 1/11
[52] U.S. Cl. ................. 361/784; 361/803; 174/260; 257/724
[58] Field of Search ........................... 361/760–764, 361/784–791, 803; 174/52.2, 52.4, 260; 439/91, 591, 65–66, 68–69, 74–75, 81–84; 257/723, 724

[56]  References Cited

U.S. PATENT DOCUMENTS

| | | | |
|---|---|---|---|
| 4,742,385 | 5/1988 | Kohmoto | 257/723 |
| 4,827,082 | 5/1989 | Horiuchi et al. | 174/52.4 |
| 5,027,191 | 6/1991 | Bourdelaise et al. | |
| 5,311,402 | 5/1994 | Kobayashi et al. | 361/760 |

FOREIGN PATENT DOCUMENTS

| | | | |
|---|---|---|---|
| 1166148 | 7/1986 | Japan | 257/723 |
| 3042859 | 2/1991 | Japan | |
| 4-105390 | 4/1992 | Japan | |
| 5-109927 | 4/1993 | Japan | 257/723 |

OTHER PUBLICATIONS by Schroeder, Jon M., "Three-Dimensional Multichip Module Packaging", *The International Journal of Microcircuits and Electronic Packaging*, vol. 16, No. 2, Second Quarter 1993, pp. 117–123.

Primary Examiner—Bot L. Ledynh
Attorney, Agent, or Firm—Young & Thompson

[57] ABSTRACT

A multichip module packaging structure provided over a mother board. A multichip module substrate is mounted over the mother board through a frame member. The frame member is provided to extend successively on a peripheral region of a bottom surface of the substrate and further extend downward from the bottom surface of the substrate. The frame member also has a top portion bonded with the bottom surface of the substrate and a bottom portion bonded with the top surface of the mother substrate so as to form a three dimensional space surrounded by the frame member, the substrate and the mother board. A plurality of semiconductor integrated circuit chips are provided on the bottom surface of the substrate so that the chips are accommodated within the three dimensional space.

14 Claims, 7 Drawing Sheets

HIGH DENSITY MULTICHIP MODULE PACKAGING STRUCTURE

BACKGROUND OF THE INVENTION

The invention relates to a high density multichip module packaging structure.

Figure 1:
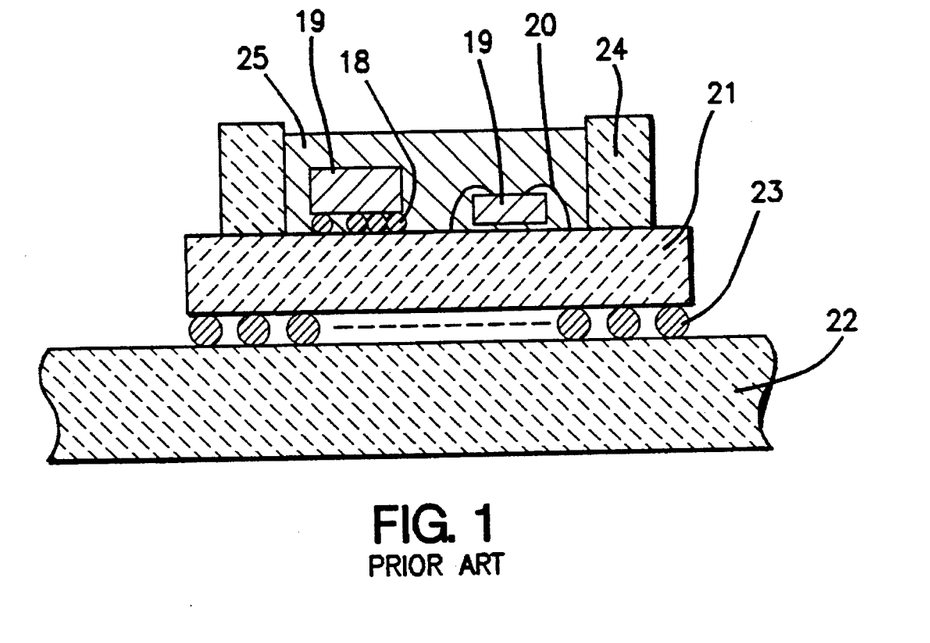
FIG. 1 is a fragmentary cross sectional elevation view illustrative of the conventional packaging structure of the multichip module.

A multichip module has been known as a valid structure for packaging a plurality of integrated circuit chips such as LSI chips on a single substrate for improvement in a packaging density. Various types of the high density packaging structures have already been developed. One of the conventional packaging structures will be described with reference to FIG. 1. A plurality of LSI chips 19 are mounted through bumps 18 or bonding wires 20 on a multichip module substrate 21. The multichip module substrate 21 is provided thereon with frames 24 surrounding a mounting region on which the plural LSI chips 19 are mounted. A space surrounding by the frames 24 provided on the multichip module substrate 21, wherein the space includes the plural LSI chips 19, is filled with a sealing resin 25 within which the LSI chips 19 are buried for sealing. The multichip module substrate 21 is mounted through bumps 23 on a mother board 22.

Figure 2A:
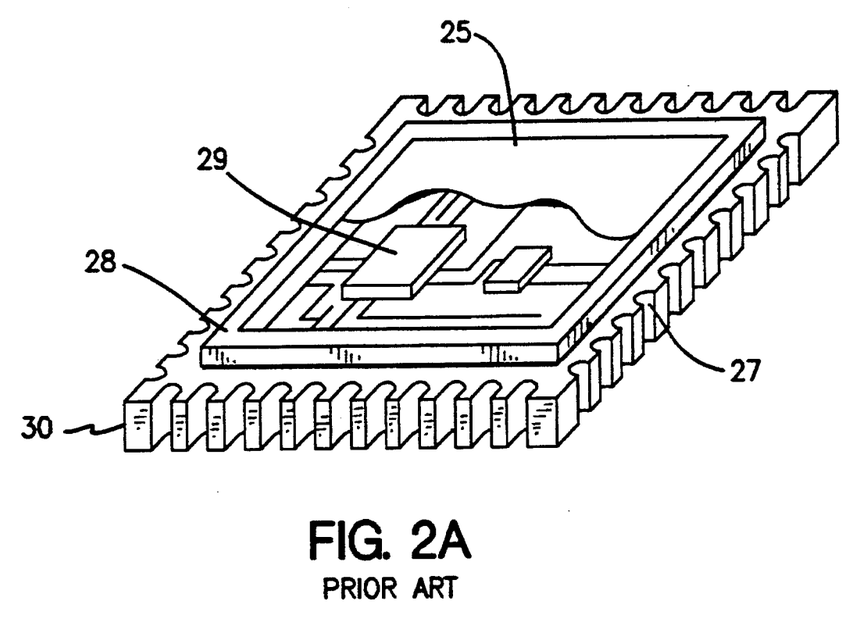
FIG. 2A is a perspective view illustrative of the other conventional packaging structure of the multichip module.
Figure 2B:
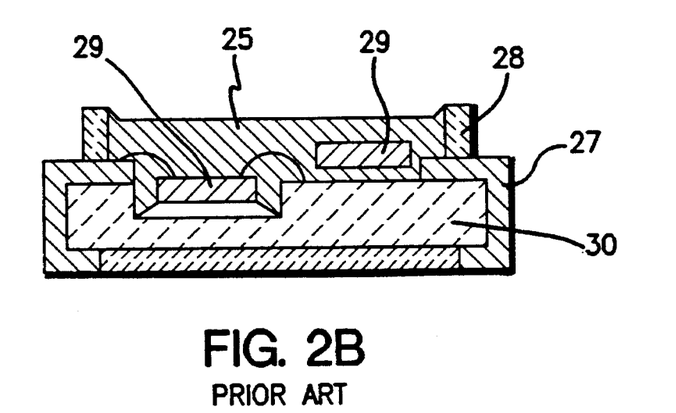
FIG. 2B is a cross sectional elevation view illustrative of the other conventional multichip module packaging structure of FIG. 2A.

Another type of conventional packaging structure is illustrated in FIGS. 2A :and 2B wherein a mother board, on which a multichip module substrate is mounted, is not illustrated. A plurality of LSI chips 29 are mounted through bumps or bonding wires 20 on a multichip module substrate 30. The multichip module substrate 30 is provided thereon with frames 28 surrounding a mounting region on which the plural LSI chips 29 are mounted. A space surrounding by the frames 28 provided on the multichip module substrate 30, wherein the space includes the plural LSI chips 29, is filled with a sealing resin 25 within which the LSI chips 29 are buried for sealing. The multichip module substrate 30 is mounted through bumps which are not illustrated on a mother board which is also not illustrated. The multichip module substrate 30 is further provided at its side face with terminals 27. The terminals 27 are provided to surround the side faces of the multichip module substrate 30.

Recently, the requirement for improvement in the high density packaging of the multichip modules has escalated increasingly. So it is required to further improve a packaging density of the multichip module. In the above described packaging structure, a bottom surface of the multichip module substrate is used only to provide a bonding surface on the mother board, for that reason it is impossible to provide any integrated circuit chips or any elements on both the top and bottom surfaces to obtain a further improvement of the packaging density. Under the above circumstances, it is required to develop a novel packaging structure for multichip modules to allow a considerable improvement in a packaging density thereof.

SUMMARY OF THE INVENTION

Accordingly, it is a primary object of the present invention to provide a novel packaging structure for a multichip module for permission of a considerable improvement in a packaging density thereof.

The above and other objects, features and advantages of the present invention will be apparent from the following descriptions.

The present invention provides a multichip module packaging structure provided over a mother board. A multichip module substrate is mounted over the mother board through a frame member. The frame member is provided to extend successively on a peripheral region of a bottom surface of the substrate and further extend downward from the bottom surface of the substrate. The frame member also has a top portion bonded with the bottom surface of the substrate and a bottom portion bonded with the top surface of the mother substrate so as to form a three dimensional space surrounded by the frame member, the substrate and the mother board. A plurality Of semiconductor integrated circuit chips are provided on the bottom surface of the substrate so that the chips are accommodated within the three dimensional space.

BRIEF DESCRIPTIONS OF THE DRAWINGS

Preferred embodiments of the present invention will hereinafter be described in detail with reference to the accompanying drawings.

DESCRIPTIONS OF THE INVENTIONS

Figure 3A:
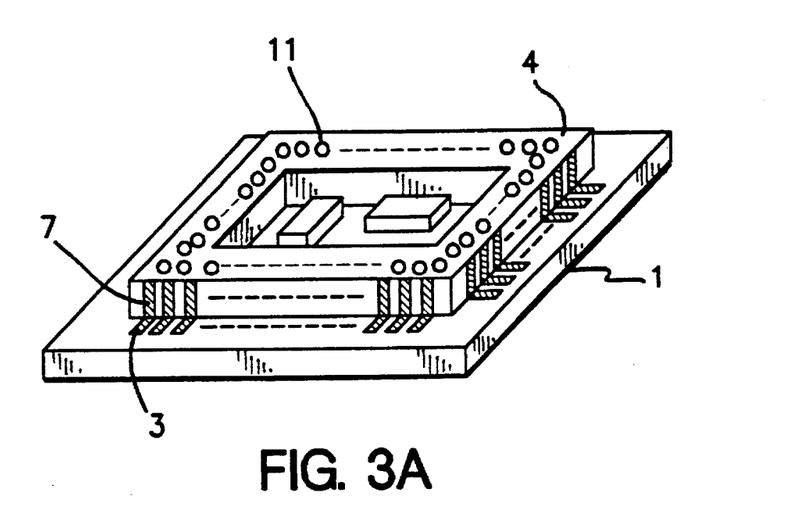
FIG. 3A is a perspective view illustrative of a novel packaging structure of the multichip module of a first embodiment according to the present invention.
Figure 3B:
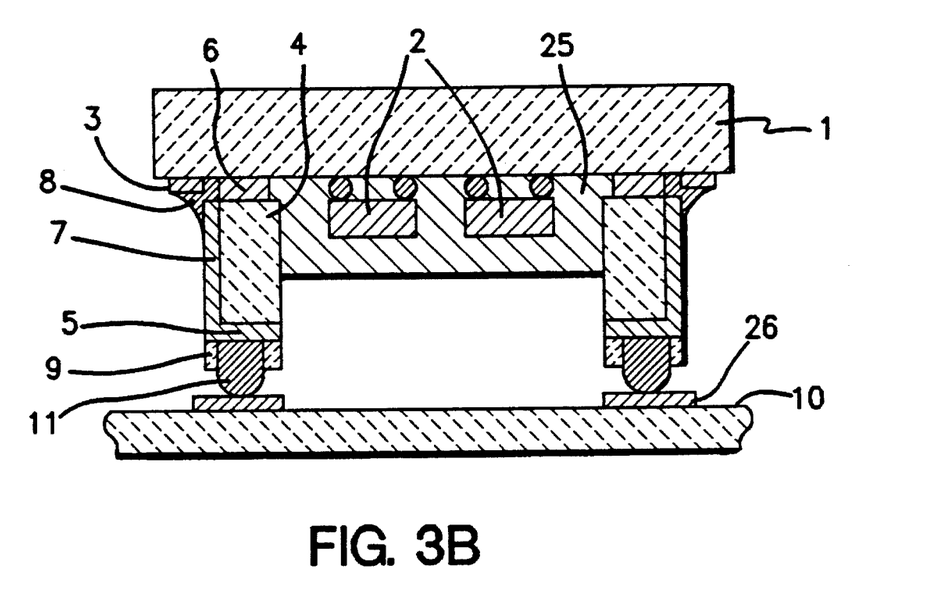
FIG. 3B is a cross sectional elevation view illustrative of a novel packaging structure of the multichip module of a first embodiment according to the present invention.

A first embodiment according to the present invention will be described with reference to FIGS. 3A and 3B in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces to a top surface of the mother board 10.

A plurality of LSI chips 2 are mounted by a flip chip method on the bottom surface of the multichip module substrate 1. In place of the flip chip method, a wire bonding method is also available to bond the LSI chip on the multichip module substrate 1. The multichip module substrate 1 may be made of a glass epoxy resin or ceramics. Frames 4 are mounted through a bonding agent 6 on a peripheral region of the bottom surface of the multichip module substrate 1 so that the frames 4 extend downward to define a space involving the LSI chips 2 under the bottom surface of the multichip module substrate 1. The space defined by the frames 4 under the bottom surface of the multichip module substrate 1 is filled with a sealing resin 25 so that the LSI chips 2 are buried in the sealing resin 25. Side terminals 7 are provided on outside walls of the frames 4. Bottom terminals 5 are provided on bottoms of the frames 4 wherein the side terminal 7 and the bottom terminal 5 are united. Connection pads 3 are provided on the bottom surface of the multichip module substrate 1 at outside regions of the frames 4. The connection pads 3 are connected through a solder 8 to an end of the side terminal 7 whose opposite end is united with the bottom terminal 5. Solder bumps 11 are provided on bottom surfaces of the bottom terminals 5. Each of the solder bumps 11 is surrounded by dams 9 made of a solder resist provided on a peripheral area of the bottom surface of the bottom terminal 5. The solder bumps 11 are placed on pads 26 provided on a top surface of the mother board 10. The solder bumps 11 may be made of cream solders such as Sn—Pb alloy, Bi—Pb alloy, In—Pb alloy.

The frames 4 are bonded on the bottom surface of the multichip module substrate 1 through the bonding agent 6 before the cream solder 8 such as Sn—Pb eutectic solder is applied on both the connection pad 3 and the top portion of the side terminal 7 by use of a dispensor for subsequent heat treatment to cause a re-flow of the cream solder 8 to thereby connect electrically the connection pad 3 to the side terminal 7. Thereafter, the sealing resin 25 is filled within the space surrounded by the frames 4 to bury the LSI chips 2 for curing of the sealing resin 25. Subsequently, the multichip module substrate 1 is placed on the mother board 10 so that the solder bumps are in contact with the pad 26 provided on the top surface of the mother board 10, followed by a heat treatment to cause a re-flow of the solder bump 11 thereby the bottom terminal 5 and the pad 26 on the mother board 10 are securely connected. As a result, the multichip module substrate 1 is electrically and mechanically connected on the mother board 10.

From the above descriptions, it could be understood that the LSI chips are accommodated within the space defined by the multichip module substrate 1, the mother board 10 and the frames 4 to thereby achieve a secure protection of the LSI chips. The multichip module substrate 1 has a relatively simple structure to thereby permit a curtail of the manufacturing cost of the packaging.

Figure 4:
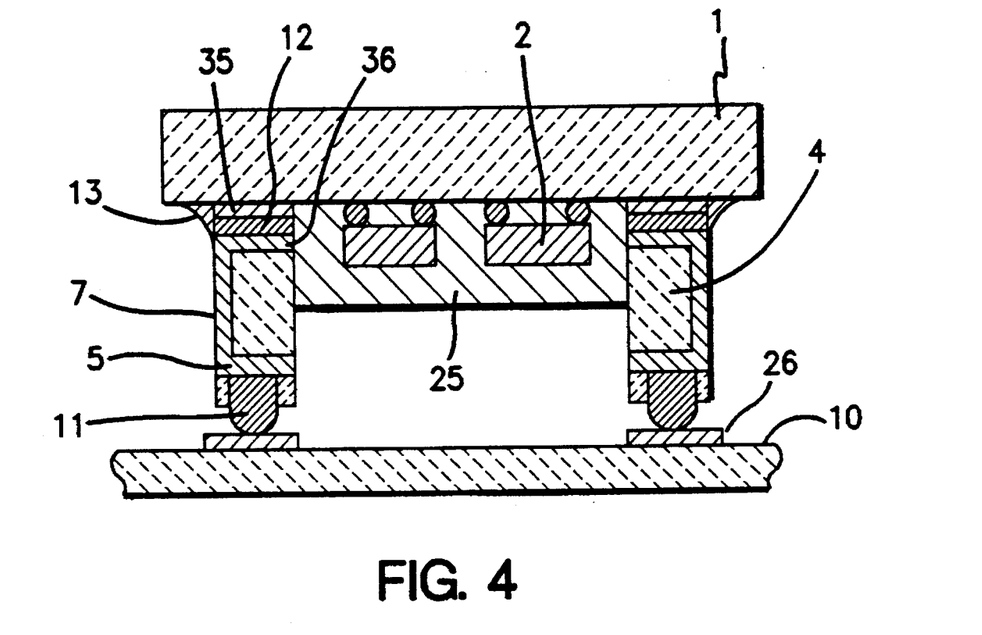
FIG. 4 is a cross sectional elevation view illustrative of a novel packaging structure of the multichip module of a second embodiment according to the present invention.

A second embodiment according to the present invention will be described with reference to FIG. 4 in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces a top surface of the mother board 10. A difference in the packaging structure between the first and second embodiments is in a structure between the frames and the multichip module substrate 1.

A plurality of LSI chips 2 are mounted by a flip chip method on the bottom surface of the multichip module substrate 1. In place of the flip chip method, a wire bonding method is also available to bond the LSI chip on the multichip module substrate 1. The multichip module Substrate 1 may be made of a glass epoxy resin or ceramics. Each of frames 4 has a top portion on which a top terminal 36 is provided. Pads 35 are provided on a peripheral region of the bottom surface of the multichip module substrate 1. The top terminal 36 overlying the frame 4 is bonded to the pad 35 on the bottom surface of the multichip module substrate 1 through a solder 12. A bonding agent 13 is applied to extend on the bottom surface of the multichip module substrate 1, the pad 35, the solder 12 and the side face of the top terminal 36 thereby the frames 4 are securely fixed on the bottom surface of the multichip module substrate 1 so that the frames 4 extend downward to define a space involving the LSI chips 2 under the bottom surface of the multichip module substrate 1. The space defined by the frames 4 under the bottom surface of the multichip module substrate 1 is filled with a sealing resin 25 so that the LSI chips 2 are buried in the sealing resin 25. Side terminals 7 are provided on outside walls of the frames 4. Bottom terminals 5 are provided on bottoms of the frames 4. The top terminal 36, the side terminal 7 and the bottom terminal 5 are united. Solder bumps 11 are provided on bottom surfaces of the bottom terminals 5. Each of the solder bumps 11 is surrounded by dams 9 made of a solder resist provided on a peripheral area of the bottom surface of the bottom terminal 5. The solder bumps 11 are placed on pads 26 provided on a top surface of the mother board 10. The solder bumps 11 may be made of cream solders such as Sn—Pb alloy, Bi—Pb alloy, In—Pb alloy.

The frames 4 are bonded on the bottom surface of the multichip module substrate 1 through the solder 12 by use of a dispensor for subsequent heat treatment to cause a re-flow of the solder 12 to thereby connect electrically the pad 35 to the top terminal 37 before the bonding agent 13 is applied. Alternatively, a thermocompression bonding method by use of an isotropic conductive sheet between the pad 36 and the top terminal 35 is also available to bond the frame 4 to the bottom surface of the multichip module substrate 1. Thereafter, the sealing resin 25 is filled within the space surrounded by the frames 4 to bury the LSI chips 2 for curing of the sealing resin 25. Subsequently, the multichip module substrate 1 is placed on the mother board 10 so that the solder bumps are in contact with the pad 26 provided on the top surface of the mother board 10, followed by a heat treatment to cause a re-flow of the solder bump 11 thereby the bottom terminal 5 and the pad 26 on the mother board 10 are securely connected. As a result, the multichip module substrate 1 is electrically and mechanically connected on the mother board 10.

From the above descriptions, it could be understood that the LSI chips are accommodated within the space defined by the multichip module substrate 1, the mother board 10 and the frames 4 to thereby achieve a secure protection of the LSI chips. The multichip module substrate 1 has a relatively simple structure to thereby permit a curtail of the manufacturing cost of the packaging.

Figure 5:
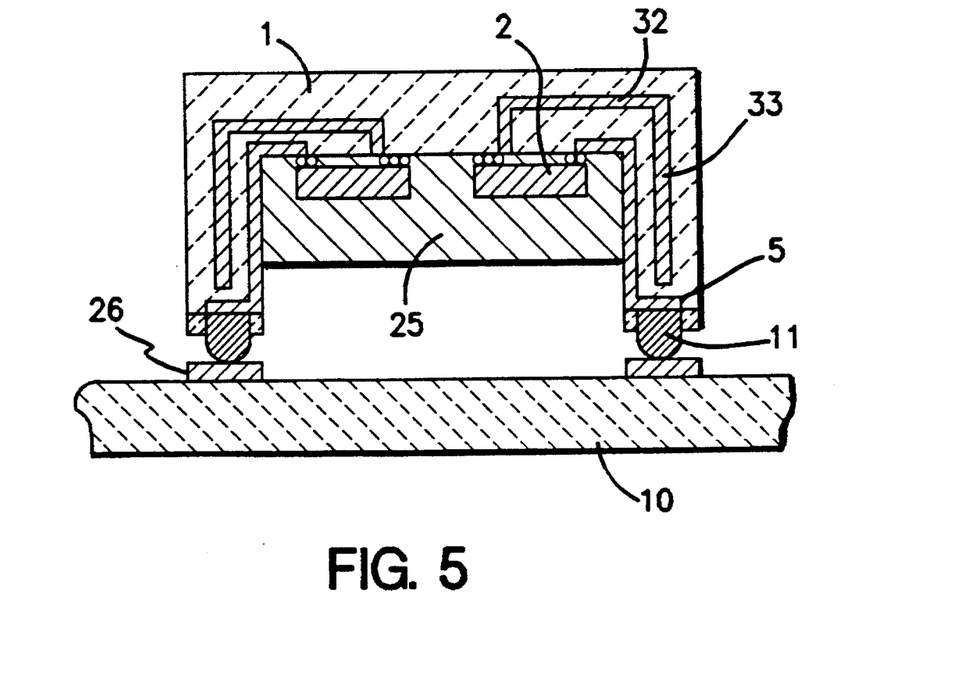
FIG. 5 is a cross sectional elevation view illustrative of a novel packaging structure of the multichip module of a third embodiment according to the present invention.

A third embodiment according to the present invention will be described with reference to FIG. 5 in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces to a top surface of the mother board 10. A difference in the packaging structure between the first and third embodiments is in a structure of the multichip module substrate 1 and in no frames being needed.

The multichip substrate 1 comprises a horizontal part extending in a parallel direction to a surface of the mother board 10 and vertical parts extending downward from a peripheral portion of the horizontal part wherein the vertical parts may serve as surrounding members in place of the frames used in the forgoing embodiments. For that reason, the third embodiment do not use the frames. The multichip module substrate 1 includes interconnections layers 32 and through holes 33. The multichip module substrate 1 may be made of a glass epoxy resin or ceramics. Each of the vertical portions of the multichip module substrate 1 has a bottom portion on which a bottom terminal 5 is provided. A plurality of LSI chips 2 are mounted by a flip chip method on the bottom surface of the multichip module substrate 1. In place of the flip chip method, a wire bonding method is also available to bond the LSI chip on the multichip module substrate 1. The vertical parts of the multichip module substrate 1 extend downward to define a space involving the LSI chips 2 under the bottom surface of the multichip module substrate 1. The space defined by the vertical parts of the multichip module substrate 1 is filled with a sealing resin 25 so that the LSI chips 2 are buried in the sealing resin 25. Solder bumps 11 are provided on bottom surfaces of the bottom terminals 5. Each of the solder bumps 11 is surrounded by dams 9 made of a solder resist provided on a peripheral area of the bottom surface of the bottom terminal 5. The solder bumps 11 are placed on pads 26 provided on a top surface of the mother board 10. The solder bumps 11 may be made of cream solders such as Sn—Pb alloy, Bi—Pb alloy, In—Pb alloy.

The sealing resin 25 is filled within the space surrounded by the frames 4 to bury the LSI chips 2 for curing of the sealing resin 25. Subsequently, the multichip module substrate 1 is placed on the mother board 10 so that the solder bumps are in contact with the pad 26 provided on the top surface of the mother board 10, followed by a heat treatment to cause a re-flow of the solder bump 11 thereby the bottom terminal 5 and the pad 26 on the mother board 10 are securely connected. As a result, the multichip module substrate 1 is electrically and mechanically connected on the mother board 10.

From the above descriptions, it could be understood that process for bonding the frames to the multichip module substrate 1 is not required. Namely, the multichip module substrate 1 has a relatively simple structure to thereby permit a curtail of the manufacturing cost of the packaging. Further, the LSI chips are accommodated within the space defined by the multichip module substrate 1 and, the mother board 10 to thereby achieve a secure protection of the LSI chips.

Figure 6A:
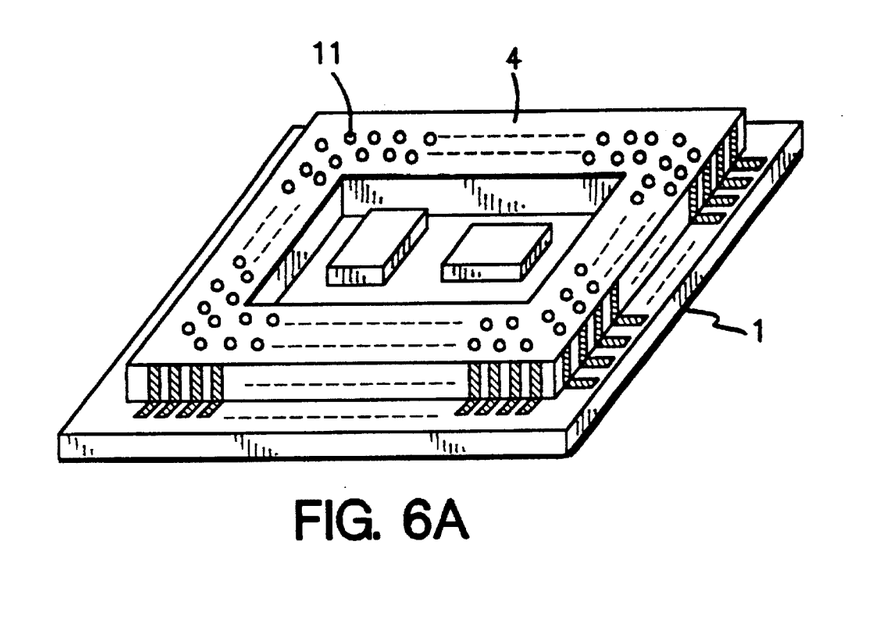
FIG. 6A is a perspective view illustrative of a novel packaging structure of the multichip module of a fourth embodiment according to the present invention.
Figure 6B:
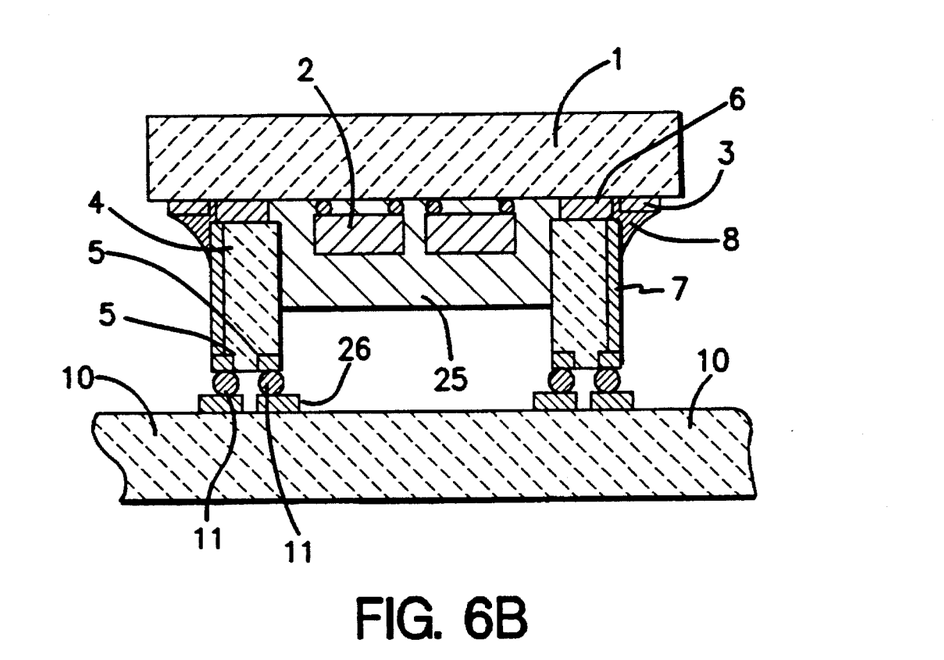
FIG. 6B is a cross sectional elevation view illustrative of a novel packaging structure of the multichip module of a fourth embodiment according to the present invention.

A fourth embodiment according to the present invention will be described with reference to FIGS. 6A and 6B in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces to a top surface of the mother board 10. A difference in the packaging structure between the first and fourth embodiments is in, structures of the bottom terminals, solder bumps 11 and pads 26 provided on the mother board 10. The bottom terminal 5 is divided into two parts, namely inside and outside parts. The pad 26 provided on the mother board 10 is also divided into two parts, namely inside and outside parts. Then, solder bumps are also provided both inside and outside parts as illustrated in FIGS. 6A and 6B. The bottom terminal 5 divided into the inside and outside parts may serve as connective terminals. Dividing the bottom terminal 5 into the inside and outside parts may permit increase of the number of the connective terminals without any increase of an area on which the connective terminals are provided.

A plurality of LSI chips 2 are mounted by a flip chip method on the bottom surface of the multichip module substrate 1. In place of the flip chip method, a wire bonding method is also available to bond the LSI chip on the multichip module substrate 1. The multichip module Substrate 1 may be made of a glass epoxy resin or ceramics. Frames 4 are mounted through a bonding agent 6 on a peripheral region of the bottom surface of the multichip module substrate 1 so that the frames 4 extend downward to define a space involving the LSI chips 2 under the bottom surface of the multichip module substrate 1. The space defined by the frames 4 under the bottom surface of the multichip module substrate 1 is filled with a sealing resin 25 so that the LSI chips 2 are buried in the sealing resin 25. Side terminals 7 are provided on outside walls of the frames 4. Bottom terminals 5 are provided on bottoms of the frames 4 wherein the side terminal 7 and the bottom terminal 5 are united. Connection pads 3 are provided on the bottom surface of the multichip module substrate 1 at outside regions of the frames 4. The connection pads 3 are connected through a solder 8 to an end of the side terminal 7 whose opposite end is united with the bottom terminal 5. Solder bumps 11 are provided on bottom surfaces of the bottom terminals 5. The solder bumps 11 are placed on pads 26 provided on a top surface of the mother board 10. The solder bumps 11 may be made of cream solders such as Sn—Pb alloy, Bi—Pb alloy, In—Pb alloy.

The frames 4 are bonded on the bottom surface of the multichip module substrate 1 through the bonding agent 6 before the cream solder 8 such as Sn—Pb eutectic solder is applied on both the connection pad 3 and the top portion of the side terminal 7 by use of a dispensor for subsequent heat treatment to cause a re-flow of the cream solder 8 to thereby connect electrically the connection pad 3 to the side terminal 7. Thereafter, the sealing resin 25 is filled within the space surrounded by the frames 4 to bury the LSI chips 2 for curing of the sealing resin 25. Subsequently, the multichip module substrate 1 is placed on the mother board 10 so that the solder bumps are in contact with the pad 26 provided on the top surface of the mother board 10, followed by a heat treatment to cause a re-flow of the solder bump 11 thereby the bottom terminal 5 and the pad 26 on the mother! board 10 are securely connected. As a result, the multichip module substrate 1 is electrically and mechanically connected on the mother board 10.

From the above descriptions, it could be understood that dividing the bottom terminal 5 into the inside and outside parts may permit increase of the number of the connective terminals without any increase of an area on which the connective terminals are provided. The LSI chips are accommodated within the space defined by the multichip module substrate 1, the mother board 10 and the frames 4 to thereby achieve a secure protection of the LSI chips. The multichip module substrate 1 has a relatively simple structure to thereby permit a curtail of the manufacturing cost of the packaging.

Figure 7:
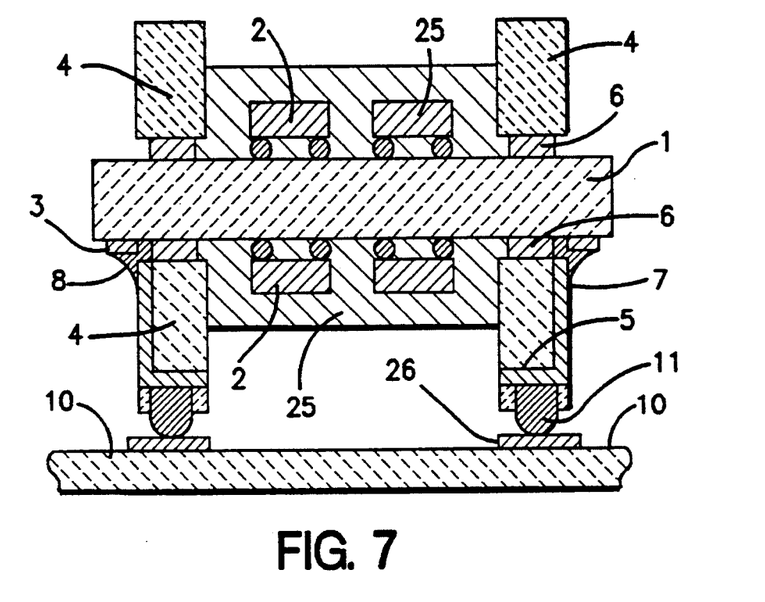
FIG. 7 is a cross sectional elevation view illustrative of a novel packaging structure of the multichip module of a fifth embodiment according to the present invention.

A fifth embodiment according to the present invention will be described with reference to FIG. 7 in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces to a top surface of the mother board 10. A difference in the packaging structure of the fifth embodiment form that of the first embodiment is in providing LSI chips, frames and sealing resins on opposite surfaces or top and bottom surfaces of the multichip module substrate 1. Providing the LSI chips, the frames and the sealing resins on both the top and bottom surfaces of the multichip module substrate 1 may allow to double the number of the LSI chips or to double the packaging density.

A plurality of LSI chips 2 are mounted by a flip chip method on the bottom surface of the multichip module substrate 1. In place of the flip chip method, a wire bonding method is also available to bond the LSI chip on the multichip module substrate 1. The multichip module Substrate 1 may be made of a glass epoxy resin or ceramics. Frames 4 are mounted through a bonding agent 6 on a peripheral region of the bottom surface of the multichip module substrate 1 so that the frames 4 extend downward to define a space involving the LSI chips 2 under the bottom surface of the multichip module substrate 1. The space defined by the frames 4 under the bottom surface of the multichip module substrate 1 is filled with a sealing resin 25 so that the LSI chips 2 are buried in the sealing resin 25. Side terminals 7 are provided on outside walls of the frames 4. Bottom terminals 5 are provided on bottoms of the frames 4 wherein the side terminal 7 and the bottom terminal 5 are united. Connection pads 3 are provided on the bottom surface of the multichip module substrate 1 at outside regions of the frames 4. The connection pads 3 are connected through a solder 8 to an end of the side terminal 7 whose opposite end is united with the bottom terminal 5. Solder bumps 11 are provided on bottom surfaces of the bottom terminals 5. The solder bumps 11 are placed on pads 26 provided on a top surface of the mother board 10. The solder bumps 11 may be made of cream solders such as Sn—Pb alloy, Bi—Pb alloy, In—Pb alloy.

Further, a plurality of LSI chips 2 are mounted by a flip chip method on the top surface of the multichip module substrate 1. Frames 4 are further mounted through a bonding agent 6 on a peripheral region of the top surface of the multichip module substrate 1 so that the frames 4 extend upward to define a space involving the LSI chips 2 over the bottom surface of the multichip module substrate 1. The space defined by the frames 4 over the bottom surface of the multichip module substrate 1 is filled with a sealing resin 25 so that the LSI chips 2 are buried in the sealing resin 25.

The frames 4 are bonded on the bottom surface of the multichip module substrate 1 through the bonding agent 6 before the cream solder 8 such as Sn—Pb eutectic solder is applied on both the connection pad 3 and the top portion of the side terminal 7 by use of a dispensor for subsequent heat treatment to cause a re-flow of the cream solder 8 to thereby connect electrically the connection pad 3 to the side terminal 7.

Thereafter, the sealing resin 25 is filled within the space surrounded by the frames 4 to bury the LSI chips 2 for curing of the sealing resin 25. Subsequently, the multichip module substrate 1 is placed on the mother board 10 so that the solder bumps are in contact with the pad 26 provided on the top surface of the mother board 10, followed by a heat treatment to cause a re-flow of the solder bump 11 thereby the bottom terminal 5 and the pad 26 on the mother board 10 are securely connected. As a result, the multichip module substrate 1 is electrically and mechanically connected on the mother board 10. Moreover, the LSI chips 2 are provided on the top surface of the multichip module substrate 1. The frames 4 are bonded on the top surface of the multichip module substrate 1 through the bonding agent 6.

Providing the LSI chips, the frames and the sealing resins on both the top and bottom surfaces of the multichip module substrate 1 may permit to double the number of the LSI chips or to double the packaging density.

Figure 8:
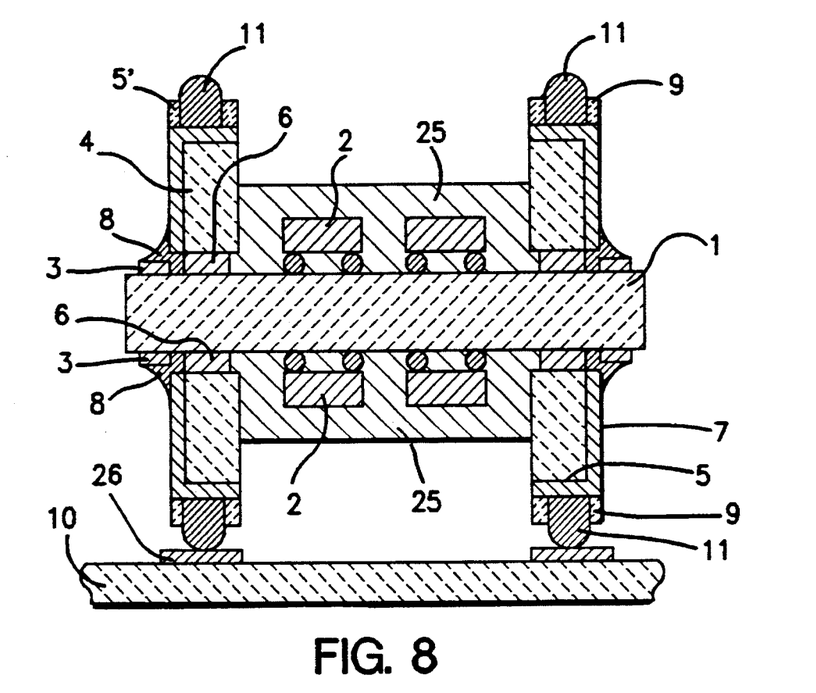
FIG. 8 is a cross sectional elevation view illustrative of a novel packaging structure of the multichip module of a sixth embodiment according to the present invention.

A sixth embodiment according to the present invention will be described with reference to FIG. 8 in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces to a top surface of the mother board 10. A difference in the packaging structure of the sixth embodiment form that of the fifth embodiment is in further providing, on the top surface of the multichip module substrate 1, a side terminal 7, a top terminal 5', a connective pad 3, a solder 8, a dam 9 and a solder bump 11. Providing the LSI chips, the frames and the sealing resins on both the top and bottom surfaces of the multichip module substrate 1 may permit to double the number of the LSI chips or to doubled the packaging density. The top solder bumps 11 are provided to serve as contacts to a test probe.

A plurality of LSI chips 2 are mounted by a flip chip method on the bottom surface of the multichip module substrate 1. In place of the flip chip method, a wire bonding method is also available to bond the LSI chip on the multichip module substrate 1. The multichip module substrate 1 may be made of a glass epoxy resin or ceramics. Frames 4 are mounted through a bonding agent 6 on a peripheral region of the bottom surface of the multichip module substrate 1 so that the frames 4 extend downward to define a space involving the LSI chips 2 under the bottom surface of the multichip module substrate 1. The space defined by the frames 4 under the bottom surface of the multichip module substrate 1 is filled with a sealing resin 25 so that the LSI chips 2 are buried in the sealing resin 25. Side terminals 7 are provided on outside walls of the frames 4. Bottom terminals 5 are provided on bottoms of the frames 4 wherein the side terminal 7 and the bottom terminal 5 are united. Connection pads 3 are provided on the bottom surface of the multichip module substrate 1 at outside regions of the frames 4. The connection pads 3 are connected through a solder 8 to an end of the side terminal 7 whose opposite end is united with the bottom terminal 5. Solder bumps 11 are provided on bottom surfaces of the bottom terminals 5. The solder bumps 11 are placed on pads 26 provided on a top surface of the mother board 10. The solder bumps 11 may be made of cream solders such as Sn—Pb alloy, Bi—Pb alloy, In—Pb alloy.

Further, a plurality of LSI chips 2 are mounted by a flip chip method on the top surface of the multichip module substrate 1. Frames 4 are further mounted through a bonding agent 6 on a peripheral region of the top surface of the multichip module substrate 1 so that the frames 4 extend upward to define a space involving the LSI chips 2 over the bottom surface of the multichip module substrate 1. The space defined by the frames 4 over the bottom surface of the multichip module substrate 1 is filled with a sealing resin 25 so that the LSI chips 2 are buried in the sealing resin 25. Side terminals 7 are provided on outside walls of the frames 4. Top terminals 5' are provided on tops of the frames 4 wherein the side terminal 7 and the top terminal 5 are united. Connection pads 3 are provided on the top surface of the multichip module substrate 1 at outside regions of the frames 4. The connection pads 3 are connected through the solder 8 to an end of the side terminal 7 whose opposite end is united with the top terminal 5'. Top solder bumps 11 surrounded by dams 9 are provided on top surfaces of the top terminals 5'.

Providing the LSI chips, the frames and the sealing resins on both the top and bottom surfaces of the multichip module substrate 1 may permit to double the number of the LSI chips or to at least double the packaging density. The top solder bumps 11 are provided to serve as contacts to a test probe.

A seventh embodiment according to the present invention will be described with reference to FIG. 9 in which a novel packaging structure of a multichip module is provided. According to the present invention, a novel bonding structure between a multichip module substrate 1 and a mother board 10 is provided wherein the multichip module substrate 1 is mounted over the mother board 10 to form a space between the substrate 1 and the board 10 so that a bottom surface of the multichip module substrate 1 faces to a top surface of the mother board 10. A difference in the packaging structure of the seventh embodiment form that of the sixth embodiment is in providing the double structures of the same multichip module substrates 1 on the mother board 10. Such double deck structure of the multichip module substrates 1 may permit a considerable increase of the number of the LSI chips or to at least double the packaging density.

Figure 9:
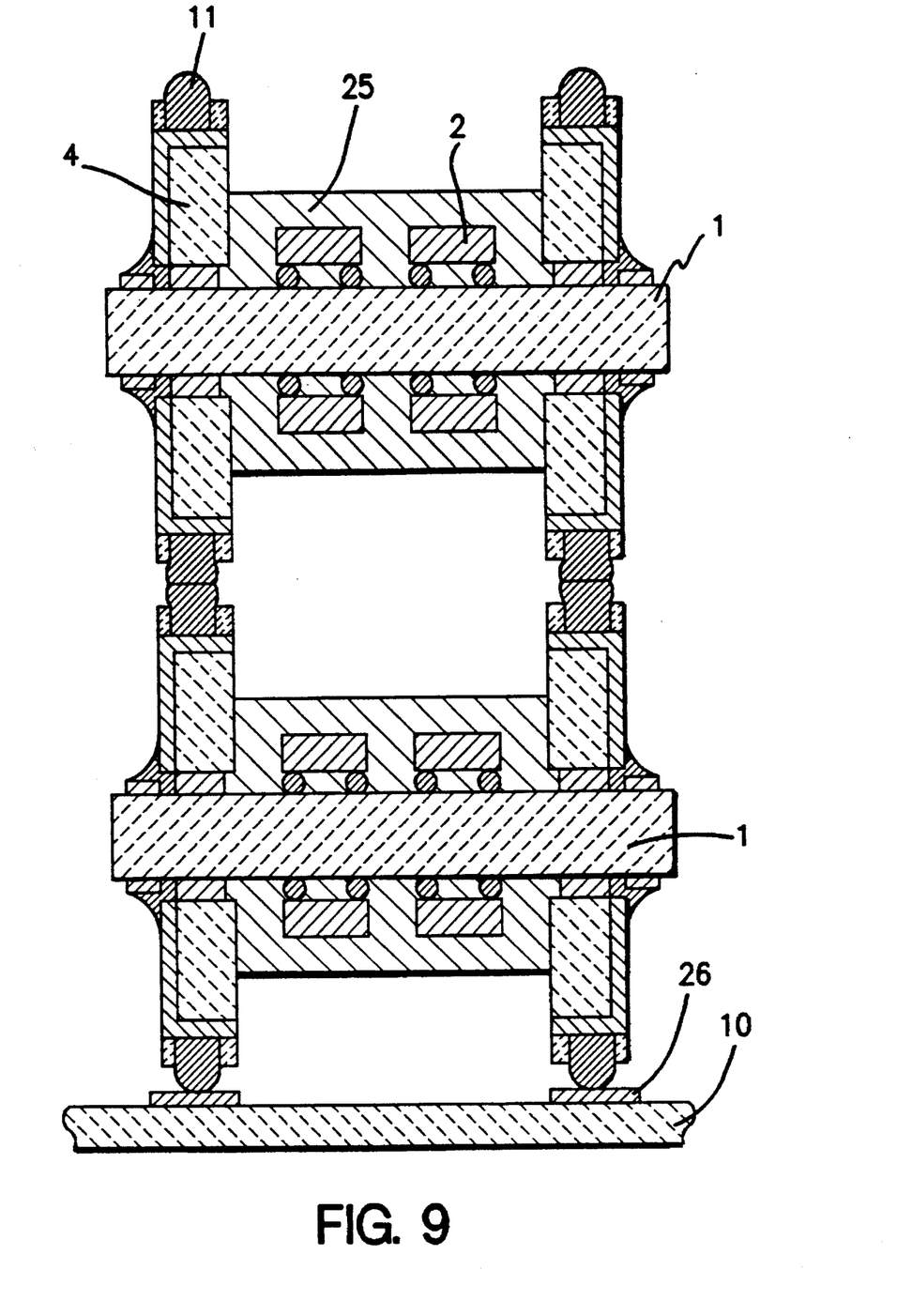
FIG. 9 is a cross sectional elevation view illustrative of a novel packaging structure of the multichip module in a seventh embodiment according to the present invention.

As modifications of the seventh embodiment, it is also available to provide further multichip module substrates on the packaging structure illustrated in FIG. 9.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the spirit and scope of the invention.

What is claimed is:

1. A multichip module packaging structure comprising:

a mother board having a plurality of first pads provided on a peripheral region of a top surface thereof;

a substrate having a plurality of second pads provided on a peripheral region of a bottom surface thereof, said substrate being mounted over said mother board through a frame member, said frame member being provided to extend successively on a peripheral region of said bottom surface of said substrate and further extend downward from said bottom surface of said substrate so as to surround a sealing resin material, said frame member having a top portion mechanically bonded with said bottom surface of said substrate;

a plurality of terminals, each of said terminals comprising: a side portion extending on an outside face of said frame member between top and bottom portions of said frame member; and a bottom portion extending on a bottom portion of said frame member, said bottom portion being united with said side portion, said frame member being mechanically connected through said bottom portions of said terminals to said mother board so as to form a three dimensional space surrounded by said frame member, said terminals electrically connecting said first pads and said second pads; and a plurality of semiconductor integrated circuit chips being provided on said bottom surface of said substrate so that said chips are completely embedded within said sealing resin material surrounded by said frame, within said three dimensional space, wherein each of said semiconductor integrated circuit chips is electrically connected to a part of said second pads, said part is positioned relatively closer to said chip than the remaining part of said second pads, whereby each said chip is electrically connected to said second pads via said first pads and said terminals which are closer to each said chip.

2. The multichip module packaging structure as claimed in claim 1, wherein said frame extends on said peripheral region of said substrate to form a rectangular shape and each side of said rectangular shape of said frame is provided with a plurality of said terminals which are positioned at a constant interval.

3. The packaging structure as claimed in claim 1, wherein each said terminal bottom portion is bonded through a bump to a corresponding one of said plurality of first pads.

4. The packaging structure as claimed in claim 3, wherein said terminal bottom portions, said bumps and said first pads are respectively divided into inside and outside parts.

5. The packaging structure as claimed in claim 1, wherein a top portion of said frame member is bonded to said bottom surface of said substrate through a bonding agent.

6. The packaging structure as claimed in claim 1, wherein said frame member is formed as a downwardly-extending wall of said substrate.

7. The packaging structure as claimed in claim 6, wherein said substrate and said downwardly-extending wall include interconnection layers and connective terminals, both of which are electrically connected between said chips and said mother board.

8. The packaging structure as claimed in claim 1, wherein a top terminal is provided on a top portion of said frame member, said top terminal being connected through a solder to said plurality of second pads.

9. The packaging structure as claimed in claim 1, wherein a top portion of said terminal side portion is electrically connected to said plurality of second pads through a solder.

10. The packaging structure as claimed in claim 1, further comprising:

an extra frame member being provided to extend successively on a peripheral region of a top surface of said substrate and further extend upward from said top surface of said substrate, said extra frame member having a bottom portion bonded with said top surface of said substrate; and a plurality of semiconductor integrated circuit chips being provided on said top surface of said substrate so that said chips are surrounded by said extra frame member.

11. The packaging structure as claimed in claim 10, further comprising:

an extra side terminal extending on an outside face of said extra frame member between top and bottom portions of said extra frame member; and an extra top terminal provided on a top portion of said extra frame member, said extra top terminal being united with a top portion of said side terminal.

12. The packaging structure as claimed in claim 11, wherein said extra top terminal comprises a bump serving as a contact to a test probe.

13. The packaging structure as claimed in claim 10, wherein said bottom portion of said extra frame member is bonded to said top surface of said substrate through a bonding agent.

14. The packaging structure as claimed in claim 10, wherein said chips provided on said top surface of said substrate are buried within a sealing resin surrounded by said frame member.

* * * * *